(12) United States Patent
Sunkara et al.

(10) Patent No.: US 7,182,812 B2
(45) Date of Patent: *Feb. 27, 2007

(54) DIRECT SYNTHESIS OF OXIDE NANOSTRUCTURES OF LOW-MELTING METALS

(75) Inventors: Mahendra Kumar Sunkara, Louisville, KY (US); Shashank Sharma, Louisville, KY (US)

(73) Assignee: University of Louisville, Louisville, KY (US)

( * ) Notice: Subject to any disclaimer, the term of this patent is extended or adjusted under 35 U.S.C. 154(b) by 11 days.

This patent is subject to a terminal disclaimer.

(21) Appl. No.: 10/664,072

(22) Filed: Sep. 16, 2003

(65) Prior Publication Data

US 2005/0072351 A1    Apr. 7, 2005

Related U.S. Application Data

(60) Provisional application No. 60/411,116, filed on Sep. 16, 2002.

(51) Int. Cl.
C30B 23/00 (2006.01)
C30B 25/00 (2006.01)

(52) U.S. Cl. .................. 117/103; 117/108; 117/944

(58) Field of Classification Search .......... 977/DIG. 1; 117/84, 103, 108, 944
See application file for complete search history.

(56) References Cited

U.S. PATENT DOCUMENTS

| | | | |
|---|---|---|---|
| 4,886,683 A | 12/1989 | Hoke et al. | |
| 4,939,308 A | 7/1990 | Maxfield et al. | |
| 5,120,707 A | 6/1992 | Maxfield et al. | |
| 5,334,296 A | 8/1994 | Henkens et al. | |
| 5,381,753 A | 1/1995 | Okajima et al. | |
| 5,725,674 A | 3/1998 | Moustakas et al. | |
| 5,858,862 A | 1/1999 | Westwater et al. | |
| 5,922,183 A | 7/1999 | Rauh | |
| 5,962,863 A | 10/1999 | Russell et al. | |
| 6,033,866 A | 3/2000 | Guo et al. | |
| 6,051,849 A | 4/2000 | Davis et al. | |
| 6,063,246 A | 5/2000 | Wolfe et al. | |
| 6,716,409 B2 * | 4/2004 | Hafner et al. | 423/447.1 |
| 6,806,228 B2 * | 10/2004 | Sharma et al. | 502/439 |
| 6,819,041 B2 * | 11/2004 | Kajiwara | 313/496 |
| 6,858,521 B2 * | 2/2005 | Jin | 438/551 |
| 6,864,162 B2 * | 3/2005 | Jin | 438/551 |
| 2001/0024084 A1 * | 9/2001 | Kajiwara | 313/486 |
| 2003/0039602 A1 * | 2/2003 | Sharma et al. | 423/349 |

FOREIGN PATENT DOCUMENTS

JP    2086121    3/1990

(Continued)

OTHER PUBLICATIONS

STN Search by Matt Anderson, Jul. 10, 2005.*

(Continued)

*Primary Examiner*—Joseph S. Del Sole
*Assistant Examiner*—Emmanuel S. Luk
(74) *Attorney, Agent, or Firm*—Carrithers Law Office PLLC; David W. Carrithers

(57) ABSTRACT

The bulk synthesis of highly crystalline noncatalytic low melting metals such as β-gallium oxide tubes, nanowires, and nanopaintbrushes is accomplished using molten gallium and microwave plasma containing a mixture of monoatomic oxygen and hydrogen. Gallium oxide nanowires were 20–100 nm thick and tens to hundreds of microns long. Transmission electron microscopy (TEM) revealed the nanowires to be highly crystalline and devoid of any structural defects. Results showed that multiple nucleation and growth of gallium oxide nanostructures can occur directly out of molten gallium exposed to appropriate composition of hydrogen and oxygen in the gas phase. These gallium oxide nanostructures are of particular interest for opto-electronic devices and catalytic applications.

68 Claims, 13 Drawing Sheets

FOREIGN PATENT DOCUMENTS

JP    11177134    7/1999

OTHER PUBLICATIONS

Publication No. WO026422A1 for "High Purity Gallium for Preparation of Compound Semiconductor, and Method and Apparatus for Purifying the Same" by Yamamura et al., published on May 11, 2000.

Publication No. WO9965068A1 for "Fabrication of Gallium Nitride Semiconductor Layers by Lateral Growth from Trench Sidewalls" by Zheleva et al., published on Dec. 16, 1999.

Publication No. WO9944224A1 for "Method of Fabricating Gallium Nitride Semiconductor Layers by Lateral Overgrowth Through Masks, and Gallium Nitride Semiconductor Structures Fabricated Thereby" by Davis et al., published on Sep. 2, 1999.

Y.F. Zhang, Y.H. Tang, N. Wang, C.S. Lee, I. Bello, S.T. Lee "One Dimensional Growth Mechanism of Crystalline Silicon Nanowires," Journal of Crystal Growth 197 (1999) 136-140.

J. Westwater, D.P. Gosain, S. Tomiya, S. Usui, and H. Ruda "Growth of Silicon Nanowires via Gold/Silane Vapor-Liquid-Solid Reaction," J. Vac. Sci. Technol. B 15(3), May/Jun. 1997, 554-557.

A.M. Morales and C.M. Lieber "A Laser Ablation Method for the Synthesis of Crystalline Semiconductor Nanowires," Science, vol. 279, Jan. 9, 1998, 208-211.

H.F. Yan, Y.J. Xing, Q.L. Hang, D.P. Yu, Y.P. Wang, J. Xu, Z.H. Xi, S.Q. Feng "Growth of Amorphous Silicon Nanowires via a Solid-Liquid-Solid Mechanism," Chemical Physics Letters 323 (2000) 224-228.

J.L. Gole and J.D. Stout, W.L. Rauch and Z.L. Wang "Direct Synthesis of Silicon Nanowires, Silica Nanospheres, and Wire-Like Nanosphere Agglomerates," Applied Physics Letters, vol. 76, No. 17, Apr. 24, 2000, 2346-2348.

J.D. Holmes, K.P. Johnston, R.C. Doty, B.A. Korgel "Control of Thickness and Orientation of Solution-Grown Silicon Nanowires," Science, vol. 287, Feb. 25, 2000, 1471-1473.

P. Scheier, J. Marsen, M. Lonfat, W. Schneider, K. Sattler "Growth of Silicon Nanostructures on Graphite," Surface Science 458 (2000, 113-122).

D.P. Yu, Z.G. Bai, Y. Ding, Q.L. Hang, H.Z. Zhang, J.J. Wang, Y.H. Zou, W. Qian, G.C. Xiong, H.T. Zhou, and S.Q. Feng "Nanoscale Silicon Wires Synthesized Using Simple Physical Evaporation," Applied Physics Letters, vol. 72, No. 26, Jun. 29, 1998, 3458-3460.

Sharma et al. "Novel Vapor-Liquid-Solid Synthesis Method for Carbon Nanostructures," presented on CD and at Carbon2001 Conference at the University of Kentucky, Lexington, KY in Jul. of 2001.

Zhang et al. "Morphology and Growth Mechanism Study of Self-Assembled Silicon Nanowires Synthesized by Thermal Evaporation," Chemical Physics Letters 337 (2001) 18-24, Mar. 30, 20014.

Wu et al. "Germanium Nanowire Growth Via Simple Vapor Transport," Chem. Mater. 2000, 12, 605-607.

Y. F. Zhang, Y.H. Tanh, N. Wang, D,P, Yu, C.S. Lee, I. Bello, and S.T. Lee "Silicon Nanowires Prepared by Laser Ablation at High Temperature," Applied physics Letters, vol. 72, No. 15, Apr. 13, 1998, 1835-1837.

D.P. Yu, Y.J. Xing, Q.L. Hang, H.F. Yan, J. Xu, Z.H. Xi, S.Q. Feng "Controlled Growth of Oriented Amorphous Silicon Nanowires via a Solid-Liquid-Solid (SLS) Mechanism," Physica E 9 (2001) 305-309.

Lieber, "One Dimensional Nanostructures: Chemistry, Physics & Applications," Solid State Communications, vol. 107, No. 11, 607-616.

C.H. Liang, G.W. Meng, G.Z. Wang, Y.W. Wang, L.D. Zhang, and S.Y. Zhang, "Catalytic Synthesis and Photoluminescence of $Ga_2O_3$ Nanowires" Appl. Phys. Lett. 78, 3202 (2001).

Y.C. Choi, W.S. Kim, Y.S. Park, S.M. Lee, D.J. Bae, Y.H. Lee, G-S Park, W.B. Choi, N.S. Lee and J.M. Kim, "Catalytic Growth of $Ga_2O_3$ Nanowires by ARC Discharge" Adv. Mater. 12, 746 (2000).

W.Q. Han, P. Kohler-Redlich, F. Ernest, and M. Ruhle, "Growth and Microstructure of $Ga_2O_3$ Nanorods" Solid State Commun. 115, 527 (2000).

J.Q. Hu, X.L. Ma, N.G. Shang, Z.Y. Xie, N.B. Wong, C.S. Lee, and S.T. Lee, "Large-Scale Rapid Oxidation Synthesis of $SnO_2$ Nanoribbons" J. Phys. Chem. B 106, 3823 (2002).

X.S. Peng, Y.W. Wang, J. Zhang, X.F. Wang, L.X. Zhao, G.W. Meng, and L.D. Zhang, "Large Scale Synthesis of $In_2O_3$ Nanowires" Appl. Phys. A 74, 437 (2002).

G. Gundiah, A. Govindaraj, and C.N.R. Rao, "Nanowires, Nanobelts and Related Nanostructures of $Ga_2O_3$" Chem. Phys. Lett. 351, 189 (2002).

S. Sharma and M.K. Sunkara, "Direct Synthesis of Gallium Oxide Tubes, Nanowires, and Nanopaintbrushes" The Journal of the American Chemical Society, 124, 12288-12293, (In Press, 2002).

Z.R. Dai, Z.W. Pan, and Z.L. Wang, "Gallium Oxide Nanoribbons and Nanosheets" J. Phys. Chem. B 106, 902-904 (2002).

M.H. Huang, Y. Wu, H. Feick, N. Tran, E. Weber, and P. Yang, "Catalytic Growth of Zinc Oxide Nanowires by Vapor Transport" Adv. Mater. 13, 113 (2001).

* cited by examiner

DIRECT SYNTHESIS OF OXIDE NANOSTRUCTURES OF LOW-MELTING METALS

This application claims priority from U.S. provisional application Ser. No. 60/411,116 filed on Sep. 16, 2002 and is incorporated by reference herein.

This application is part of a government project. The research leading to this invention was supported NSF through CAREER grant (CTS 9876251) and an infratructure grant (EPS 0083103. The United States Government retains certain rights in this invention.

BACKGROUND OF THE INVENTION

1. Field of the Invention

The invention relates to the field of providing a synthesis technique to produce bulk amounts of gallium oxide nanowires, micron scale tubes, and paintbrush-like structures synthesized by direct reaction of atomic oxygen and hydrogen radicals with molten gallium.

2. Description of the Prior Art

Nanostructures find unique applications in electronics, optoelectronics, and catalysis due to their high surface to volume ratio, enhanced material characteristics due to quantum confinement effects and the high fraction of chemically similar surface sites. Functionalization of these nanostructures can only be achieved and become useful through the synthesis of bulk quantities of defined structures with controlled composition, crystallinity and morphology. Gallium oxide is a wide-bandgap material and is of interest due to its interesting bulk properties such as conduction and luminescence. These properties make it a candidate for gas sensing, catalytic, and optoelectronic device applications. Nanostructures of gallium oxide will be of particular interest for these applications.

Gallium oxide nanowires have been synthesized using several techniques such as physical evaporation, arc discharge, and catalyst assisted methods. All of these techniques have been thought to proceed according to two primary mechanisms. The first mechanism involves carbothermal reduction of gallium oxide to produce gas phase gallium suboxide growth species. The second mechanism relies on transition metal catalyst or evaporated gallium clusters to provide the necessary template for size control of the resulting nanowires.

SUMMARY OF THE INVENTION

Low melting metals (for example, gallium) provide the solvent medium for bulk nucleation and growth of nanowires, thereby eliminating the need for transition metal clusters as growth templates. Large droplets (millimeter size) or thin gallium films are spread on substrates to initiate nucleation with densities greater than 10 11/cm. The large number density of the resulting nanowires makes the technique suitable and interesting for large-scale production. The gas phase chemistry is used to manipulate the absolute size, composition, and crystallinity of the nanowires. The only requirement is that the materials of interest should have extremely low solubility and low wetting characteristics with respect to molten gallium. If the solute wets the molten metal then two-dimensional crystals (platelets) or three-dimensional crystals are more likely to result rather than one-dimensional crystals.

Molten gallium can be used as the growth medium with synthesis of both silicon and carbon nanowires. In the instant invention, bulk nucleation and growth of gallium oxide nanostructures are formed from molten gallium pools using a microwave oxygen plasma. This direct synthesis approach for producing oxide nanowires can be easily extended to other metals such as aluminum, indium, tin, and zinc. In addition, the instant invention provides a means for the synthesis of unique geometrical structures of crystalline gallium oxide in the form of tubes and nanopaintbrushes. Several geometrical nanostructures have been produced including spheres, rods, tubes, and belts. Of course it is contemplated that other geometric structures known in the art can be formed as well.

The synthesis of nanopaintbrushes represents first of its kind for any inorganic solid.

The present invention provides a method for the bulk synthesis of highly crystalline β-gallium oxide nanowires using molten gallium and a microwave plasma based gas chemistry. Gallium oxide nanowires, 20–100 nm thick and tens to hundreds of microns long were synthesized and confirmed to be crystalline and devoid of any structural defects using transmission electron microscopy. Multiple nucleation and growth of gallium oxide nanowires were obtained with appropriate gas phase composition of hydrogen and oxygen. Direct use of gallium melts in plasma environments allowed bulk synthesis with high nucleation densities and also allowed template-free synthesis of nanostructures with unique geometries. This plasma-based technique allowed for synthesis at temperatures much lower than conventional methods. The gas phase chemistry allowed manipulation of the nanostructure composition, structure, and morphology. Demonstration of this technique with gallium oxide presents a new route for synthesis of nanostructures of other important metal oxides such as indium oxide, tin oxide, and zinc oxide. Synthesis of unique geometrical structures of crystalline gallium oxide in the form of tubes and nanopaintbrushes have been developed. Several geometrical models of nanostructures including spheres, rods, tubes and belts have been developed resulting in the synthesis of the nanopaintbrushes.

Furthermore, the bulk synthesis of highly crystalline beta-gallium oxide tubes, nanowires, and unique one-dimensional structures in the form of nanopaintbrushes has been accomplished using molten gallium and microwave plasma containing a mixture of monoatomic oxygen and hydrogen. Results show that multiple nucleation and growth of gallium oxide nanostructures occur directly out of molten gallium upon exposure to appropriate composition of hydrogen and oxygen in the gas phase. From the data, it is possible to present a growth model for the observed morphologies in the one-dimensional structures. Oxygen from the vapor phase forms surface adsorbed species on the molten gallium surface. These oxygenated gallium species dissolve into molten gallium followed by phase segregation to create multiple nuclei on the surface. In the absence of hydrogen in the plasma, these nuclei aggregate to form a polycrystalline crust on the molten gallium surface. However hydrogen/oxygen chemistry enables nuclei segregation on the gallium surface, preventing the complete crust formation. These nuclei grow in one dimension upon basal attachment of the bulk growth species. The surface dynamics of nuclei on molten gallium, i.e., pattern formation, and the time of coalescence determine the morphology of the resulting structure. Thus, results show that the gas phase chemistry allows manipulation of the nanostructure composition, structure, and morphology.

Moreover, the results show the synthesis of gallium oxide nanowires that were 20–100 nm thick and tens to hundreds of microns long. Individual nanowires were characterized for crystallinity, composition, and contamination using high-resolution transmission electron microscopy (HRTEM) and energy dispersive x-ray spectroscopy (EDX) respectively. Demonstration of this technique with gallium oxide certainly presents a new route for synthesis of nanostructures of other important metal oxides such as indium oxide, tin oxide, and zinc oxide.

In summary the present invention provides a method of synthesizing bulk quantities of highly crystalline noncatalytic low melting metals, comprising the steps of exposing molten noncatalytic low melting metals and microwave plasma containing a mixture of monoatomic oxygen and hydrogen to selected amounts of hydrogen and oxygen in the gas phase; and forming multiple nucleation and growth of noncatalytic low melting metal nanostructures directly therefrom creating highly crystalline metal oxide nanowires devoid of any structural defects having a range of from 20 to 100 nm thick and a range of up to a thousand microns long and more typically from 10 to several hundred microns long.

It is an object of the present invention to utilize the direct synthesis approach involving low-melting metals providing a technique for working at lower temperatures than those required for traditional catalyst-assisted and physical evaporation methods.

It is another object of the present intention to synthesize one-dimensional nanostructures for metal oxides applying the direct synthesis approach of the instant invention, where one would not need the creation of gas phase growth species.

It is another object of the present invention to provide a method of control over the morphology of the one-dimensional nanostructures due to manipulability of the gas phase chemistry alone.

It is another object of the present intention to control the plasma uniformity over molten metal surfaces in order to tune the resulting one-dimensional morphology.

Other objects, features, and advantages of the invention will be apparent with the following detailed description taken in conjunction with the accompanying drawings showing a preferred embodiment of the invention.

BRIEF DESCRIPTION OF THE DRAWINGS

A better understanding of the present invention will be had upon reference to the following description in conjunction with the accompanying drawings in which like numerals refer to like parts throughout the several views and wherein.

DESCRIPTION OF THE PREFERRED EMBODIMENT

The present invention relates to a novel direct synthesis technique for oxide nanostructures of a variety of low-melting metals. This technique involves exposing pool of a molten metal to an environment of oxygen and hydrogen radicals at elevated temperatures. Thermodynamic calculations show that molten metals such as Ga, In, Al, Sn, and Zn spontaneously oxidize at very moderate oxygen partial pressure. The present invention provides a method to inhibit spontaneous nucleation and growth of the metal oxide crust on the molten metal surface.

Figure 20:
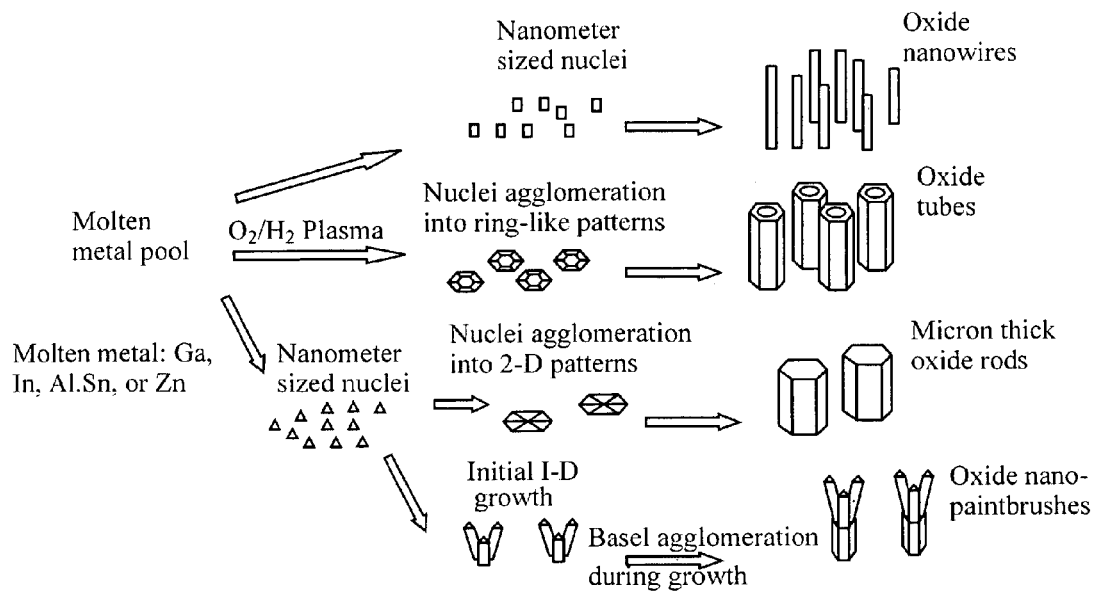
FIG. 20 is a schematic showing multiple nucleation and growth of metal oxide nanostructures out of a molten metal pool upon exposure to appropriate composition of hydrogen and oxygen in the gas phase, whereby the gas phase chemistry allows manipulation f the nanostructure composition, structure, and morphology.

As shown in the schematic shown in FIG. 20, multiple nucleation and growth of metal oxide nanostructures occurs directly out of a molten metal pool upon exposure to appropriate composition of hydrogen and oxygen in the gas phase. Oxygen from the vapor phase forms surface adsorbed species on the molten metal surface. These oxygenated metal species dissolve into the bulk melt followed by phase segregation to create multiple nuclei on the surface. In the absence of hydrogen in the plasma, these nuclei aggregate to form a polycrystalline crust on the molten metal surface. However hydrogen/oxygen chemistry enables nuclei segregation on the melt surface, preventing the complete crust formation. These nuclei grow in one dimension upon basal attachment of the bulk growth species. The dynamics of the pattern formation and the time of nuclei coalescence determine the morphology of the resulting structure. Thus, the gas phase chemistry allows manipulation of the nanostructure composition, structure, and morphology.

Synthesis was carried out in a microwave plasma reactor (ASTEX 5010) using $H_2CH_4O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. During the plasma exposure, molten gallium flowed on all the substrates forming a thin film, which followed by formation of a thin polycrystalline film along with sparse nanowires. Gallium droplets were intentionally put on these polycrystalline oxide covered substrates and further synthesis experiments were carried out. The nanowires and other one-dimensional structures were grown from these large gallium drops. The substrate temperature was measured using an infrared pyrometer to be approximately 550° C. for 700 W microwave power, 40 Torr total pressure, and 8.0 sccm $O_2$ in 100 sccm of hydrogen in the inlet stream. The experiments were performed at the following range of growth conditions: microwave power of 600–1200 W, pressure of 30–60 Torr, growth duration of 1–12 hours, 0.6–10 sccm $O_2$ 0–2 sccm $CH_4$ in 100 sccm of hydrogen in the feed gas. The post-synthesis samples were imaged using a LEO 1430 scanning electron microscope (SEM). As-grown samples were analyzed for crystalline quality using a Rigaku powder X-ray diffractometer (XRD). Individual nanowires were analyzed for crystallinity and composition using high-resolution transmission electron microscopy (HRTEM) (200 kV JEOL 2010F) and Energy Dispersive X-ray spectroscopy (EDX). The samples for TEM analysis were prepared by scraping the nanowire mass from the substrate, dispersing in acetone and dropping on to a copper TEM grid.

The feasibility of this direct synthesis approach has been demonstrate for $Ga/Ga_2O_3$. Also bulk amounts of highly crystalline beta-gallium oxide tubes, nanowires, and unique one-dimensional structures has been synthesized in the form of nanopaintbrushes using molten gallium and microwave plasma containing a mixture of monoatomic oxygen and hydrogen. Synthesis was carried out in a microwave plasma reactor (ASTEX 5010) using $H_2/CH_4/O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. The substrate temperature was measured using an infrared pyrometer to be approximately 550° C. for 700 W microwave power, 40 Torr total pressure, and 8.0 sccm O2 in 100 sccm of hydrogen in the inlet stream. The experiments were performed at the following range of growth conditions: microwave power of 600–1200W, pressure of 30–60 Torr, growth duration of 1–12 hours, 0.6–10 sccm $O_2$ 0–2 sccm $CH_4$ in 100 sccm of hydrogen in the feed gas.

Synthesis was carried out in a microwave plasma reactor (ASTEX 5010) using $H_2/CH_4/O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. During the plasma exposure, molten gallium flowed on all the substrates forming a thin film, which followed by formation of a thin polycrystalline film along with sparse nanowires. Gallium droplets were intentionally put on these polycrystalline oxide covered substrates and further synthesis experiments were carried out. The nanowires and other one-dimensional structures discussed in this paper were grown from these large gallium drops. The substrate temperature was measured using an infrared pyrometer to be approximately 550° C. for 700 W microwave power, 40 Torr total pressure, and 8.0 scam $O_2$ in 100 scam of hydrogen in the inlet stream. The experiments were performed at the following range of growth conditions: microwave power of 600–1200 W, pressure of 30–60 Torr, growth duration of 1–12 hours, 0.6–10 scam $O_2$ 0–2 scam $CH_4$ in 100 scam of hydrogen in the feed gas. The post-synthesis samples were imaged using a LEO 1430 scanning electron microscope (SEM). As-grown samples were analyzed for crystalline quality using a Rigaku powder X-ray diffractometer (XRD). Individual nanowires were analyzed for crystallinity and composition using high-resolution transmission electron microscopy (HRTEM) (200 kV JEOL 2010F) and Energy Dispersive X-ray spectroscopy (EDX). The samples for TEM analysis were prepared by scraping the nanowire mass from the substrate, dispersing in acetone and dropping on to a copper TEM grid.

Based on the average values of surface energies for gallium oxide (1.105 $J/m^2$ determined from heat of sublimation data and molten gallium (0.718 $J/m^2$, the contact angle is estimated as 180° using the equation of state and Young's equation. Poor wet-ability of gallium oxide with molten gallium was further confirmed by two different experimental observations. Molten gallium film spread on polycrystalline gallium oxide film was converted into droplets when exposed to microwave plasma containing oxygen and hydrogen radicals for less than ten minutes. The second experimental observation was the convex meniscus indicating obtuse contact angle between the gallium oxide rod and the molten gallium at the interface. In theory, other molten metals such as In, Al, Sn, and Zn would also form a convex meniscus with their oxides due to high surface energies.

Figure 1:
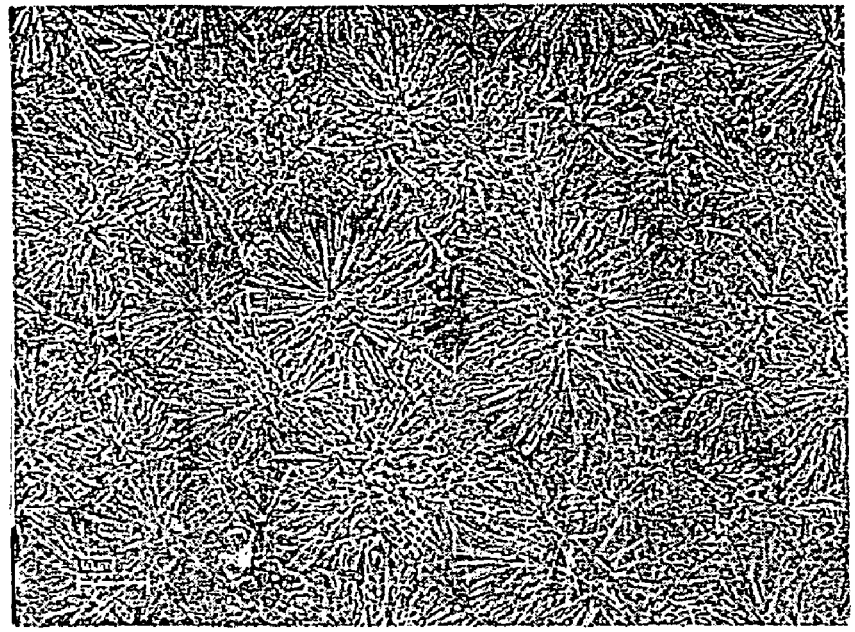
FIG. 1 shows an image taken with a scanning electrom microscope of multiple sub-micron thick gallium oxide needles grown from a large gallium pool.
Figure 2:
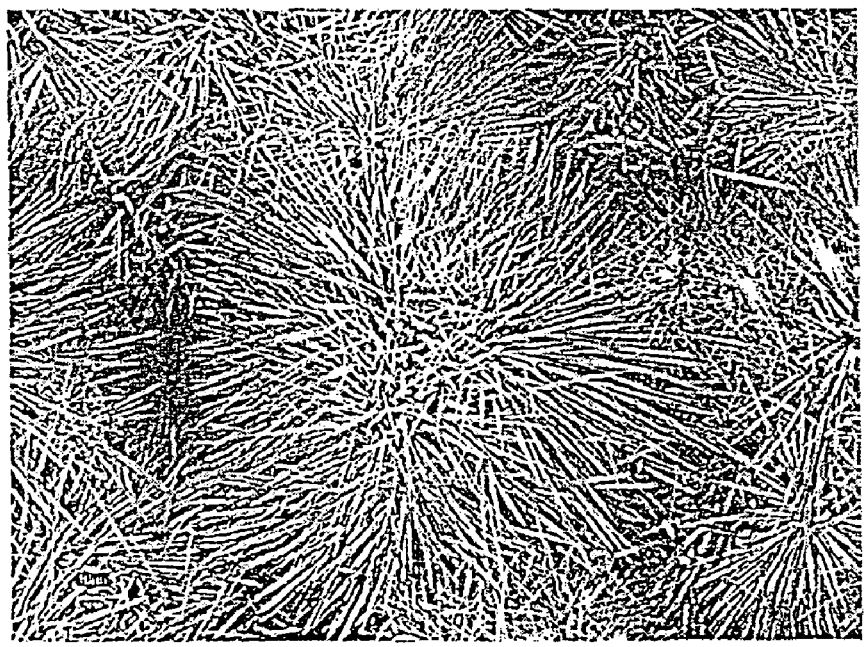
FIG. 2 shows an image taken with a scanning election microscope of multiple sub-micron thick gallium oxide needles grown from a large gallium pool.
Figure 3:
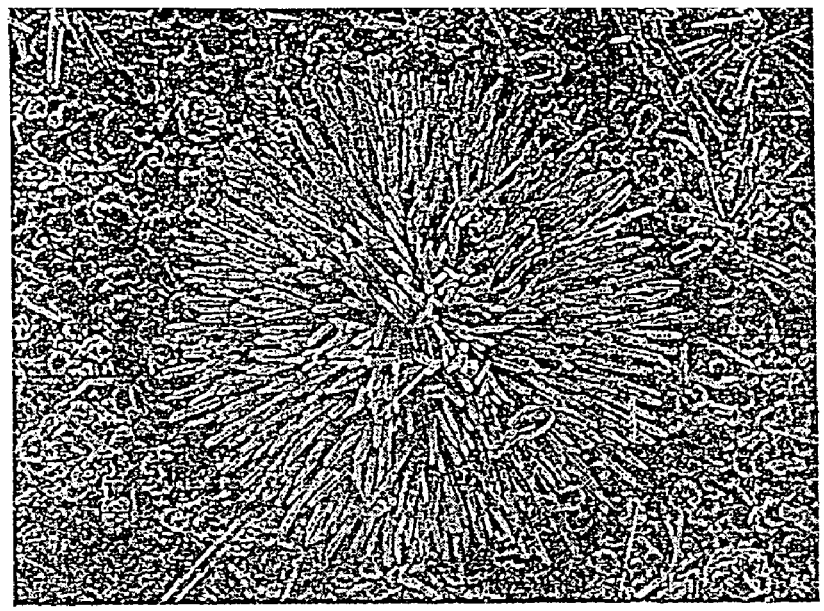
FIG. 3 shows an image taken with a scanning election microscope of multiple sub-micron thick gallium oxide needles grown from a large gallium pool.
Figure 4:
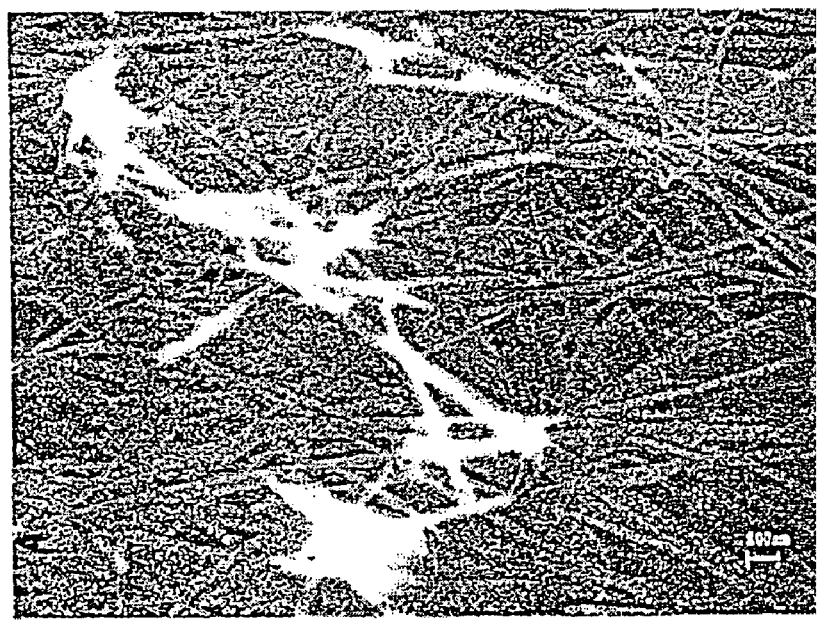
FIG. 4 shows an image taken with a scanning electrom microscope of nanometer scale gallium oxide rods.
Figure 5:
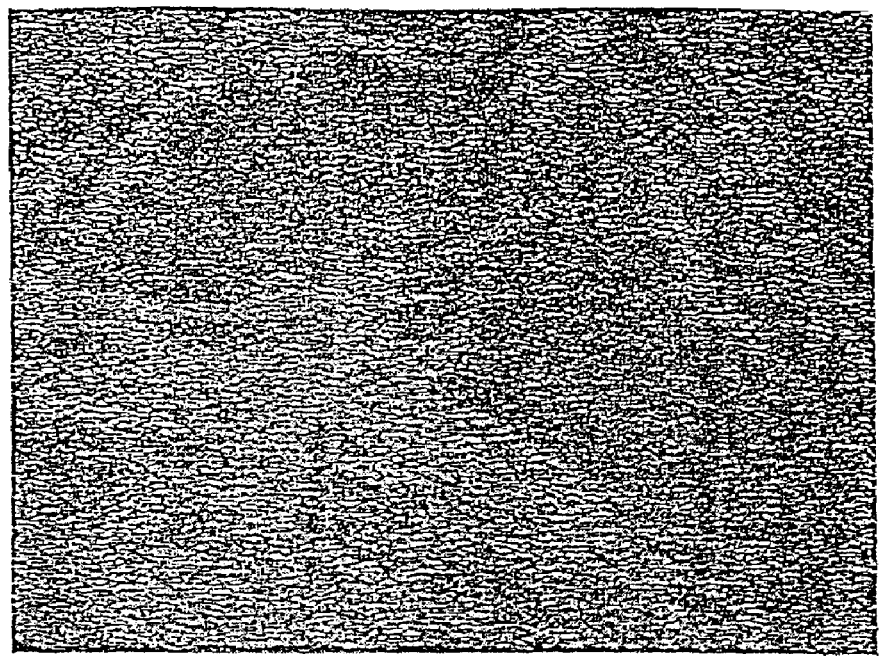
FIG. 5 shows an image taken with a scanning election microscope of nanometer scale gallium oxide rods.
Figure 6:
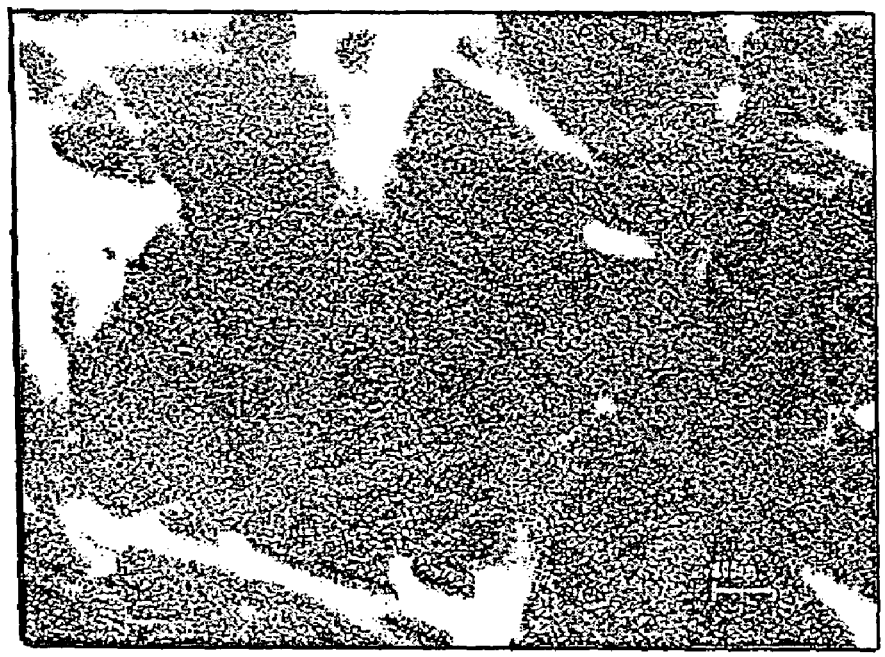
FIG. 6 shows an image taken with a scanning election microscope of nanometer scale gallium oxide rods.
Figure 7:
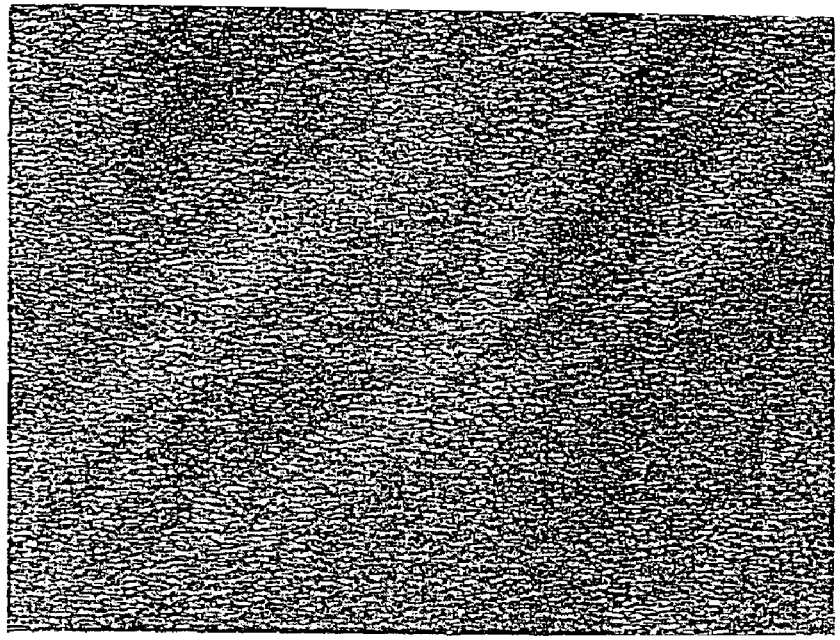
FIG. 7 shows an image taken with a scanning election microscope of nanometer scale gallium oxide rods.
Figure 8:
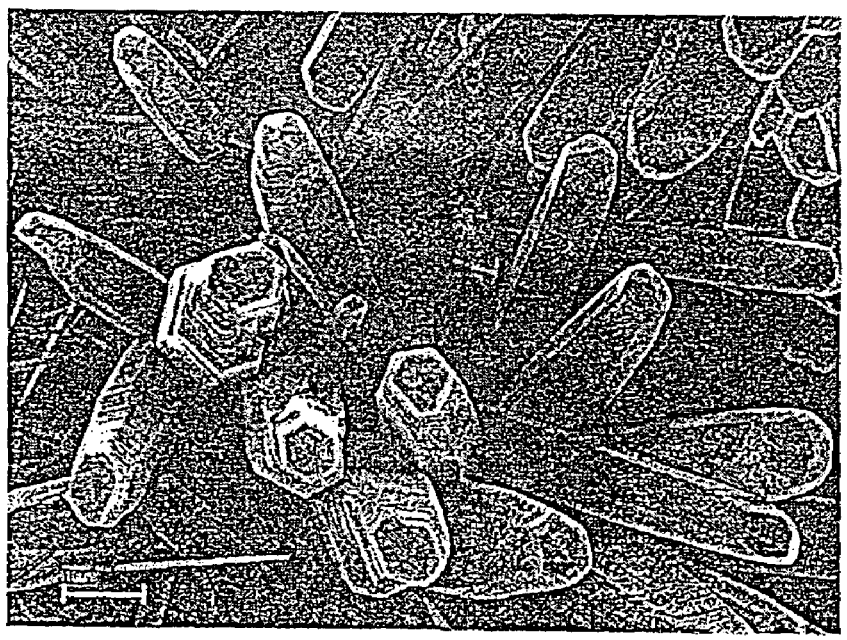
FIG. 8 shows an image taken with a scanning electrom microscope nanoscale wires, with well faceted one-dimensional structures thicker than 5 μm.
Figure 9:
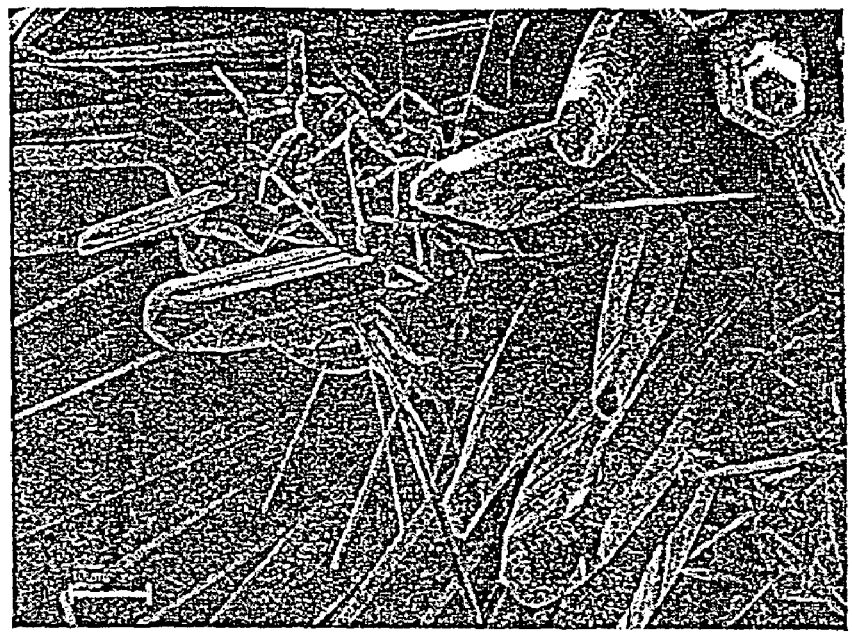
FIG. 9 shows an image taken with a scanning election microscope nanoscale wires, with well faceted one-dimensional structures thicker than 5 μm.
Figure 10:
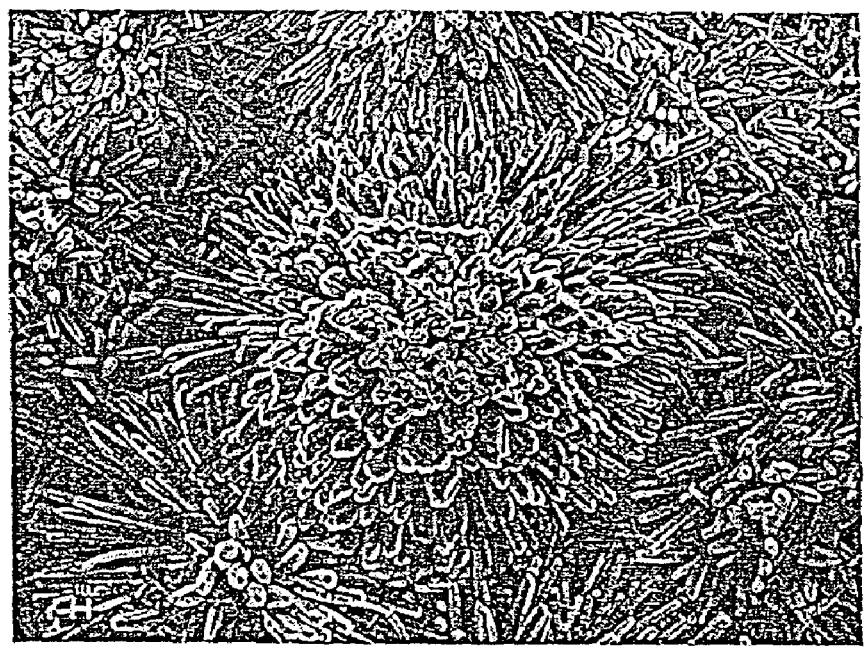
FIG. 10 shows an image taken with a scanning election microscope nanoscale wires, with well faceted one-dimensional structures thicker than 5 μm.
Figure 11:
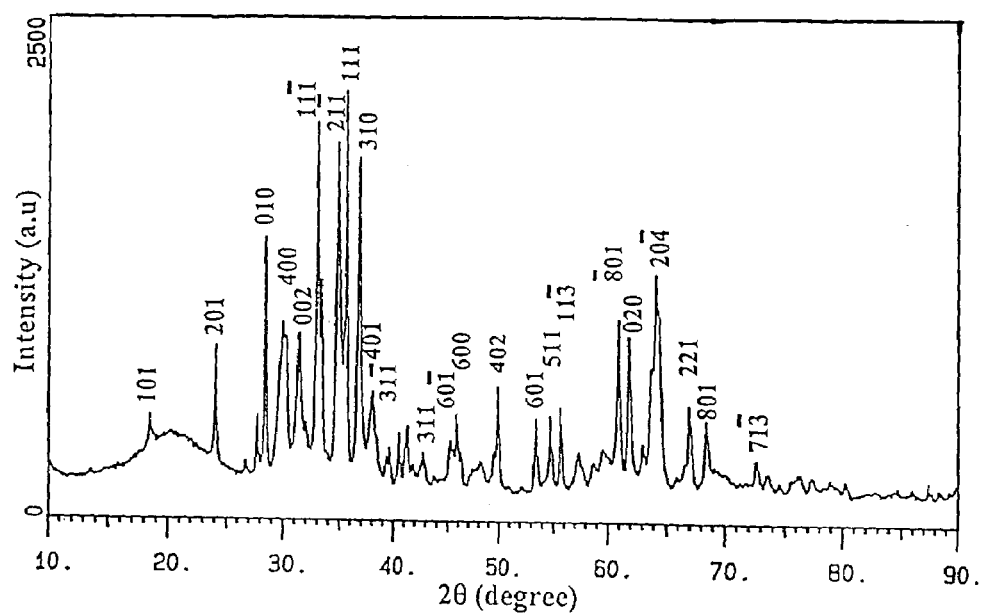
FIG. 11 shows a plot of intensity vs. degree taken with an X-ray diffractometer confirming the as synthesized sample to be monoclinic gallium oxide phase (a0–12.23 Å, b0=3.04 Å, c0=5.6 Å, b=103.7°, C2/m)
Figure 22:
FIG. 22 shows a bulk syntheses illustrating a one dimensional gallium oxide with sub-micron thick and nanometer scale gallium oxide rods.

As shown in FIGS. 1, 3, and 22, SEM images of multiple sub-micron thick and nanometer scale gallium oxide form needles grown from a large gallium pool. In addition to nanoscale wires, well faceted one-dimensional structures thicker than 5 μm were also obtained as shown in FIG. 8. The XRD (spectrum not shown) confirmed the as synthesized sample to be monoclinic gallium oxide phase ($a_0$=12.23 Å, $b_0$=3.04 Å, $c_0$=5.8 Å, $\beta$=103.7 C2/m).

FIG. 1 illustrates the bulk synthesis of one dimensional gallium oxide. FIGS. 1, 3, and 22 show sub-micron thick and nanometer scale gallium oxide rods. FIG. 8 shows a well-faceted micron thick gallium oxide rods synthesized using a large gallium pool and microwave plasma containing atomic oxygen. In addition to the nanowires, nanostructures were obtained with paintbrush-like and tubular morphologies on the substrate stage around the substrate that was towards the edge of the dense plasma region.

As illustrated in FIGS. 12, 13, 16 and 23, the individual whiskers have tip diameters ranging from 10–100 nm. Table 1 lists the experimental conditions under which different one-dimensional morphologies were obtained. In the current plasma reactor setup, a ball shaped plasma sits at the center of a circular substrate stage, which makes conditions (radical densities) to be different at different radial positions.

Figure 12:
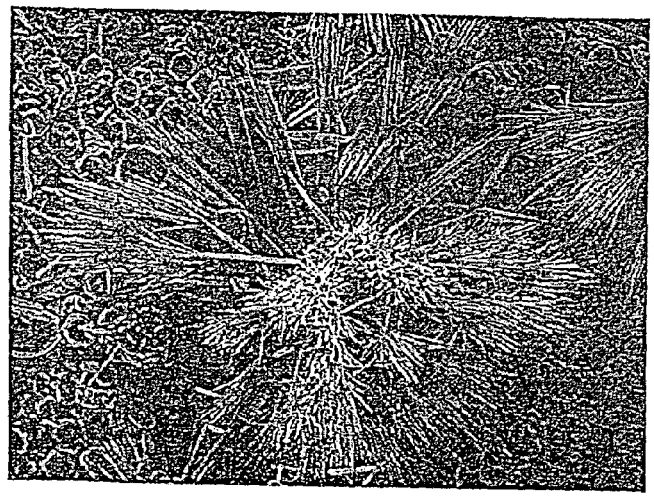
FIG. 12 shows an image taken with a scanning electrom microscope depicting nanostructures with paintbrush-like and tubular morphologies on the substrate stage around the substrate that was towards the edge of the dense plasma region having individual whiskers with tip diameters ranging from 10–100 nm.
Figure 13:
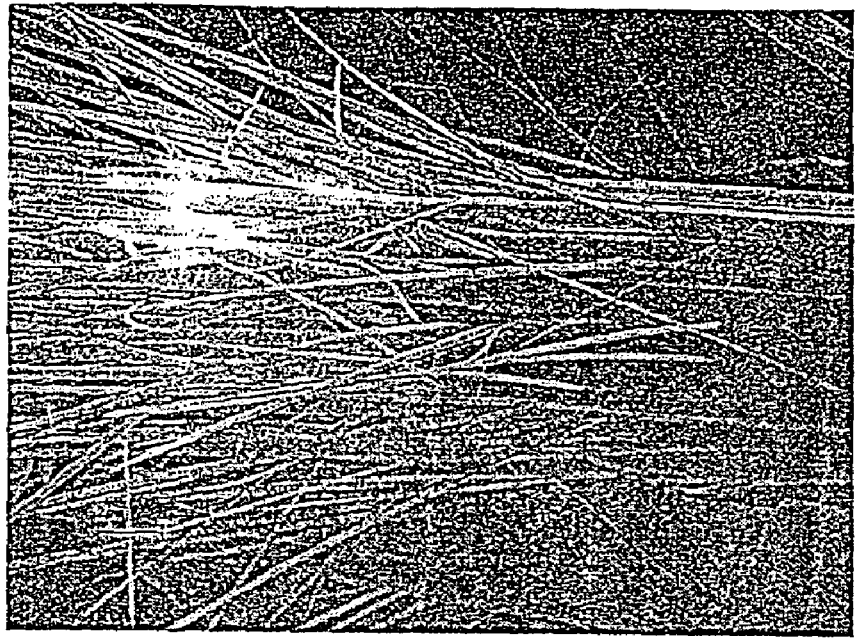
FIG. 13 shows an image taken with a scanning election microscope depicting nanostructures with paintbrush-like and tubular morphologies on the substrate stage around the substrate that was towards the edge of the dense plasma region having individual whiskers with tip diameters ranging from 10–100 nm.
Figure 14:
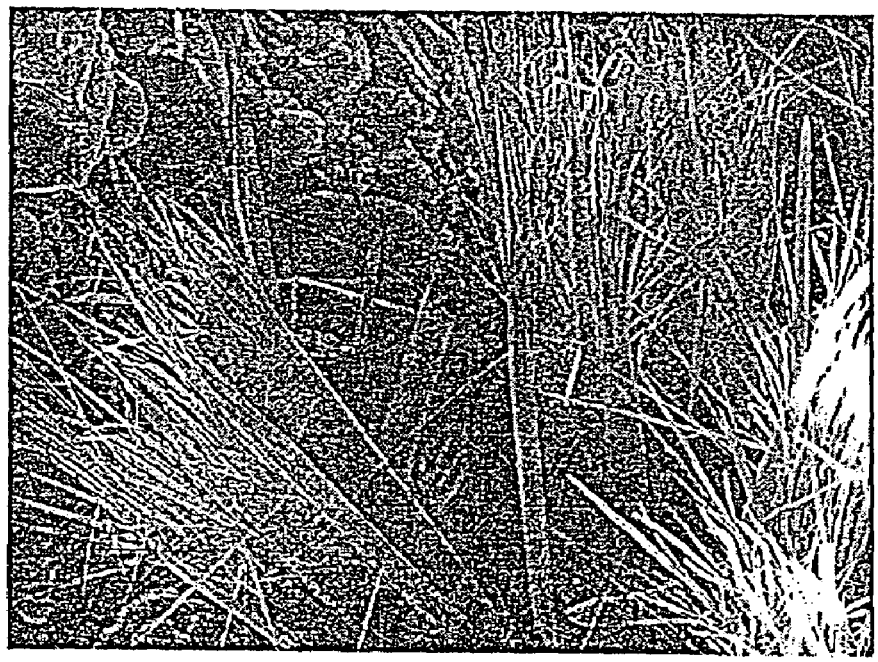
FIG. 14 shows an image taken with a scanning election microscope depicting nanostructures with paintbrush-like and tubular morphologies on the substrate stage around the substrate that was towards the edge of the dense plasma region having individual whiskers with tip diameters ranging from 10–100 nm.
Figure 15:
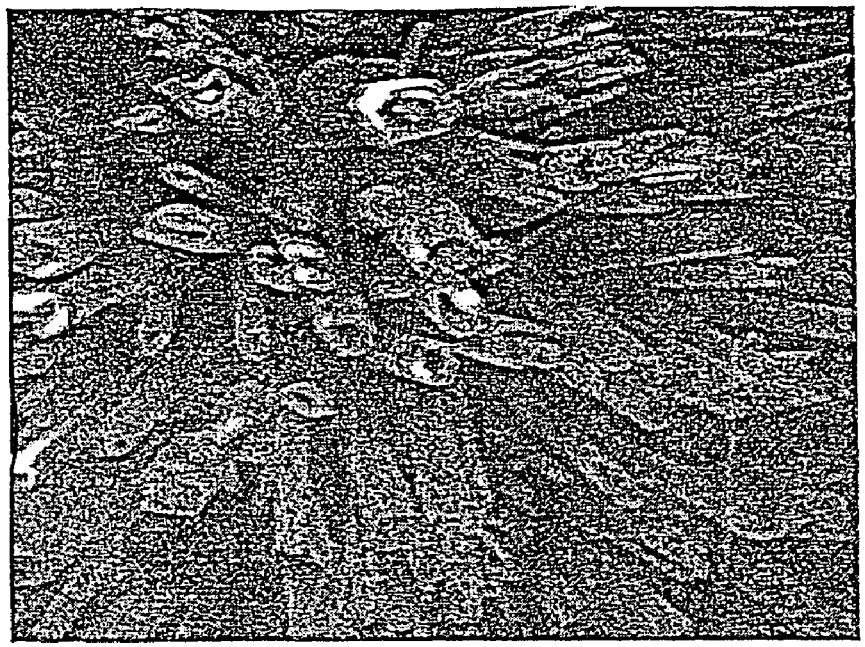
FIG. 15 shows an image taken with a scanning election microscope depicting nanostructures with paintbrush-like and tubular morphologies on the substrate stage around the substrate that was towards the edge of the dense plasma region having individual whiskers with tip diameters ranging from 10–100 nm.
Figure 16:
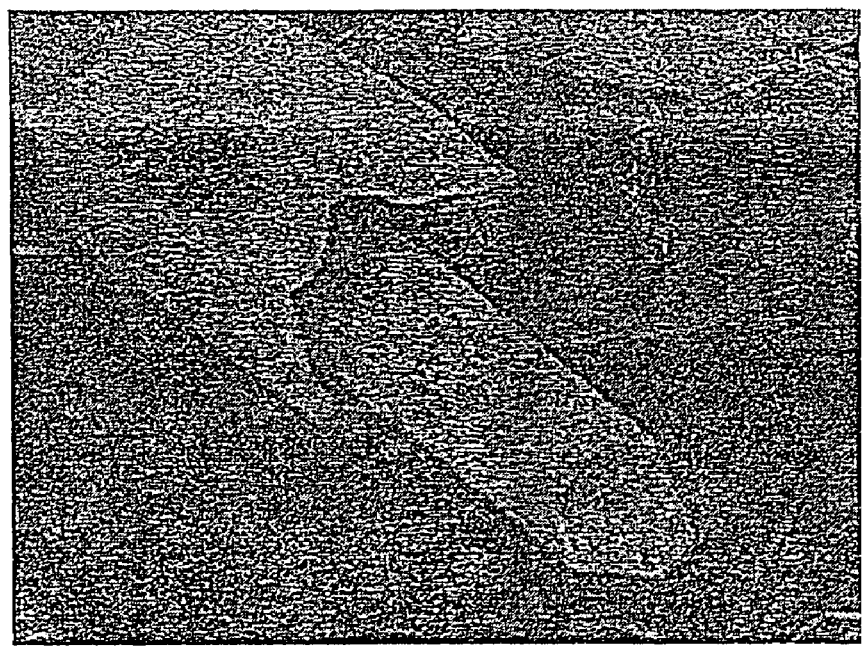
FIG. 16 shows an image taken with a scanning election microscope depicting nanostructures with paintbrush-like and tubular morphologies on the substrate stage around the substrate that was towards the edge of the dense plasma region having individual whiskers with tip diameters ranging from 10–100 nm.
Figure 17:
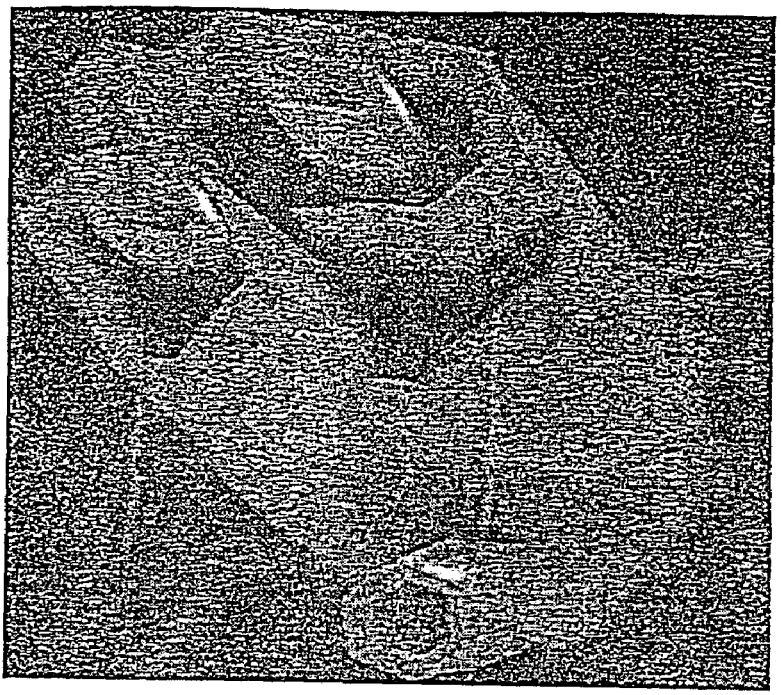
FIG. 17 shows an image taken with a scanning election microscope depicting nanostructures with paintbrush-like and tubular morphologies on the substrate stage around the substrate that was towards the edge of the dense plasma region having individual whiskers with tip diameters ranging from 10–100 nm.

FIG. 16 shows gallium oxide 1-D structures with interesting morphologies. FIG. 12 shows a cluster of paintbrush-like one-dimensional structures of gallium oxide grown out of a gallium pool. FIG. 13 depicts an individual gallium oxide nanopaintbrush. FIGS. 16 and 22 show micron scale gallium oxide tubes grown in the same experiment as the structures in FIGS. 12 and 13.

TABLE 1

Summary of experimental conditions versus the resulting one-dimensional structures.

| Morphology | Flow rate of $O_2$ in 100 sccm of $H_2$ (sccm) | Microwave power (W) | Pressure (Torr) | Duration (Hr) | Location on the substrate |
|---|---|---|---|---|---|
| Nanoscale wires | 0.6–10 | 600–900 | 30–50 | 1–12 | On top of the micron to millimeter sized gallium droplets near the center of the substrate |
| Micro scale, well faceted rods | 0.6–10 | 600–900 | 30–50 | 1–12 | Clustered around the micron to millimeter sized gallium droplets |
| Nanopaintbrushes | 7–10 | 600–1200 | 30–60 | 2–10 | Near the edges of the substrate |
| Micron scale | 7–10 | 600–1200 | 30–60 | 2–10 | Near the edges of the substrate |

Figure 18:
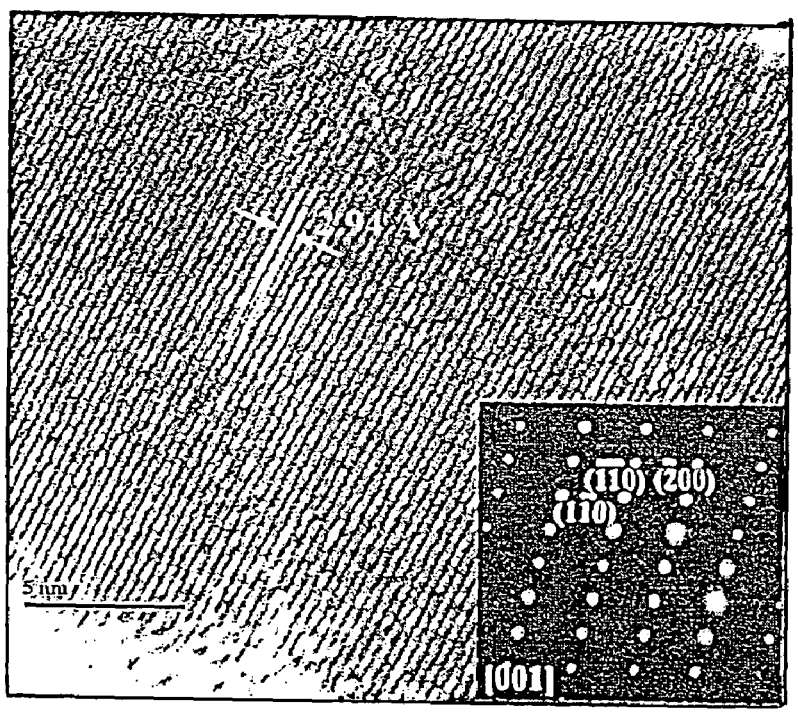
FIG. 18 shows an images taken with a high resolution scanning electrom microscope (HRTEM) (200 kV JEOL 2010F) of a 25 nm thick gallium oxide nanowire together with an insert showing the corresponding selected area electron diffraction pattern taken along the [001] zone axis.
Figure 19:
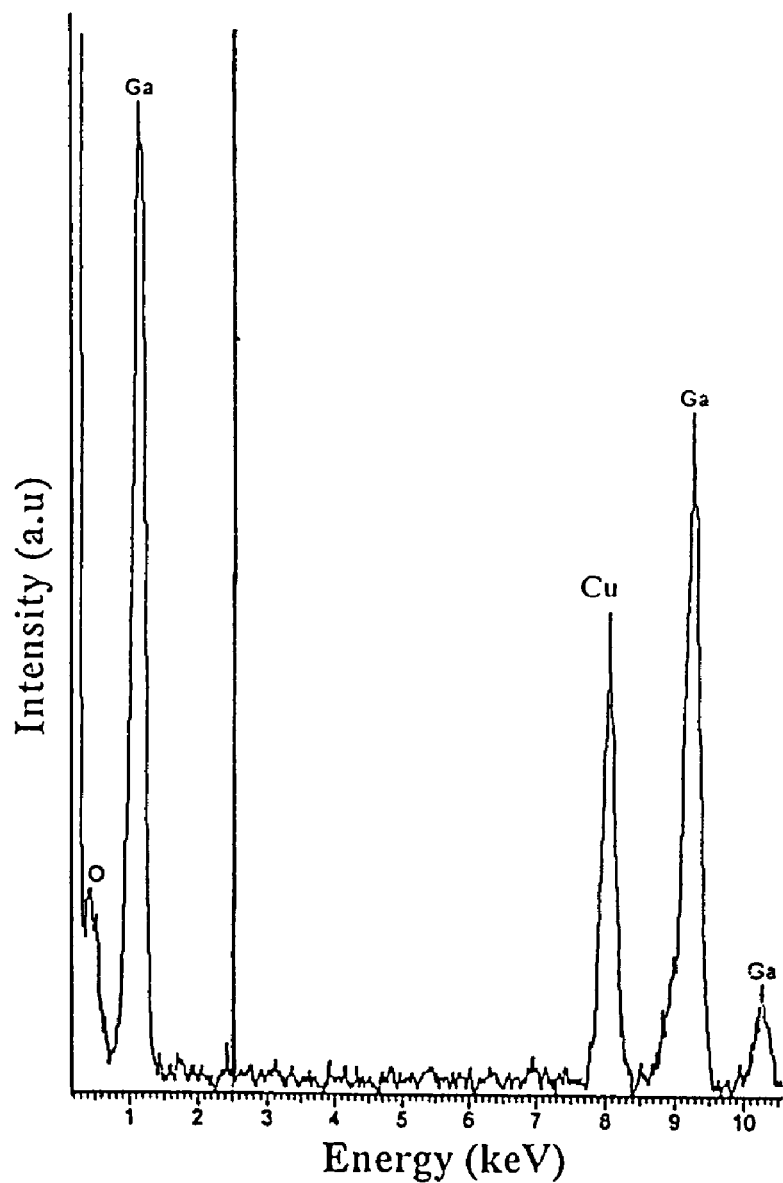
FIG. 19 shows an energy dispersive x-ray spectrum (EDX) taken from an individual nanowire, confirming the elemental composition to be gallium and oxygen.

The EDX (spectrum not shown) confirmed that the individual nanowires consist of Ga (K at 9.3 keV, at 1.11 eV) and O (K at 0.53 keV). FIG. 3A shows a bright field TEM image of a 100 nm thick nanowire. The HRTEM image in FIG. 18 shows a 25 nm thick gallium oxide nanowire. The lattice spacing in HRTEM image also matched that for bulk beta-gallium oxide. The insert in FIG. 18 shows the corresponding selected area electron diffraction pattern taken along the [001] zone axis.

The nanowire growth direction was determined to be [110]. Three nanowire samples were examined and the high-resolution TEM results were similar, i.e., structures were devoid of any stacking faults. The absence of stacking faults within the nanowire structures contradicts prior suggestions of structural defect mediated growth mechanisms for one-dimensional structures. For example, in the case of diamond cubic materials, it was previously suggested that two or more parallel stacking faults are required to form a re-entrant corner for continuous kink creation and step propagation. Typically, the re-entrant corner mediation for growth of a crystal would not necessarily lead to one-dimensional structures. Thus, the present experimental results with nucleation and growth of multiple nanowires from molten gallium suggest a different nucleation and growth phenomenon.

Figure 23:
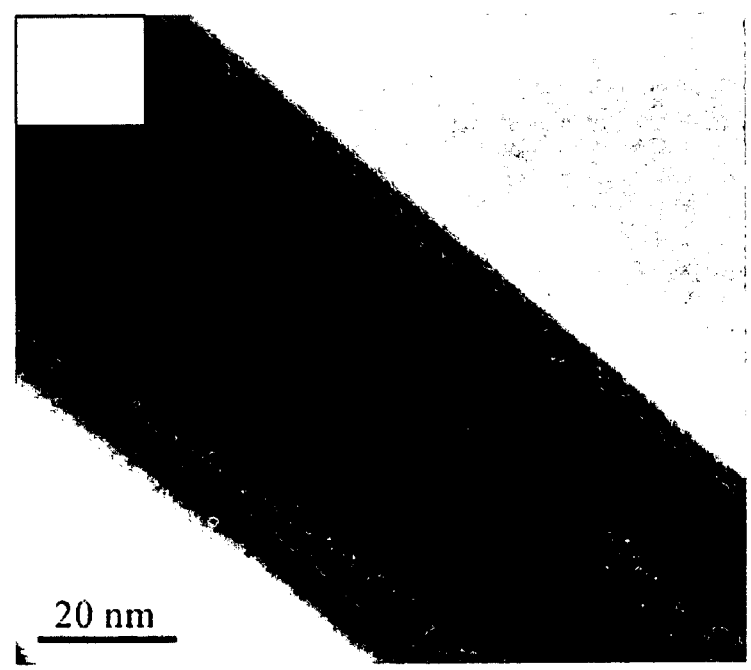
FIG. 23 shows a transmission electron microscopy analysis of individual nanowires depicting a bright field TEM image of an individual gallium oxide nanowire about 100 nm thick.
Figure 24:
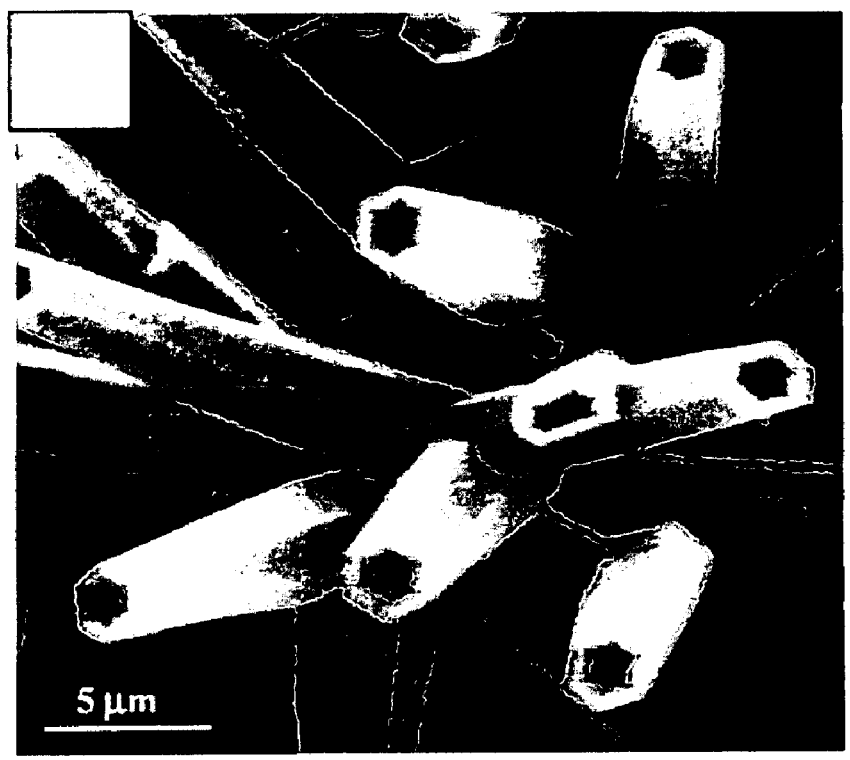
FIG. 24 shows a gallium oxide 1-D structure illustrating a micron scale gallium oxide tubes grown out of a gallium pool.

FIGS. 18 and 23 illustrates TEM analysis of individual nanowires. FIG. 23 shows bright field TEM image of an individual gallium oxide nanowire about 100 nm thick. FIG. 18 shows a HRTEM image of a 25 nm thick nanowire. The insert shows a selected area electron diffraction pattern taken along the [001] zone axis. It is postulated that the nucleation and growth of oxide nanowires occurs in three basic steps: (1) dissolution of oxygenated gallium species into molten gallium; (2) phase segregation to create multiple nuclei on the surface; and (3) homo-epitaxial growth of nuclei into one-dimensional structures from the bottom using the dissolved species. The surface dynamics of nuclei on molten gallium, i.e., pattern formation and the time of coalescence determine if the resulting nanostructure would be a nanowire, tube, or nanopaintbrush.

As depicted in the schematic in FIG. 20, the rapid dissolution process results in the spontaneous nucleation of nanometer-scale metal oxide nuclei on the surface. More particularly, as shown in the schematic in FIG. 21, the rapid dissolution process results in the spontaneous nucleation of nanometer-scale gallium oxide nuclei on the surface. These surface-segregated nuclei in the absence of re-dissolution could coalesce on the surface to form a crust. The crust formation prevents further growth of nanometer-scale nuclei in one-dimension and leads to thick, polycrystalline film over molten gallium. Due to poor wetability of gallium oxide with gallium, the gallium oxide nuclei surface out but do not propagate laterally thus ensuring growth in one dimension perpendicular to the molten gallium surface. In the case of hexagonal nuclei formation, lateral growth is probably unavoidable, as these nuclei would propagate parallel to the molten gallium surface thus eliminating the possibility of growing into a nanowire. This has been observed with plasma nitridation of bulk pools of molten gallium using pure nitrogen environments at substrate temperature of 800° C. or greater. In this case, nitrogen plasma exposure resulted in hexagonal, platelet shaped GaN crystals forming a crust over the molten gallium surface. The resulting crust was found to be highly c-plane textured with in-plane orientation between crystals. However, the plasma nitridation of thin gallium films resulted in the growth of gallium nitride nanowires due to the deprived supply of gallium necessary for lateral growth of platelet shaped crystals. In the present work, hydrogen/oxygen chemistry seems to provide simultaneous dissociation of surface-segregated oxide nuclei to prevent complete crust formation enabling one-dimensional growth.

Figure 21:
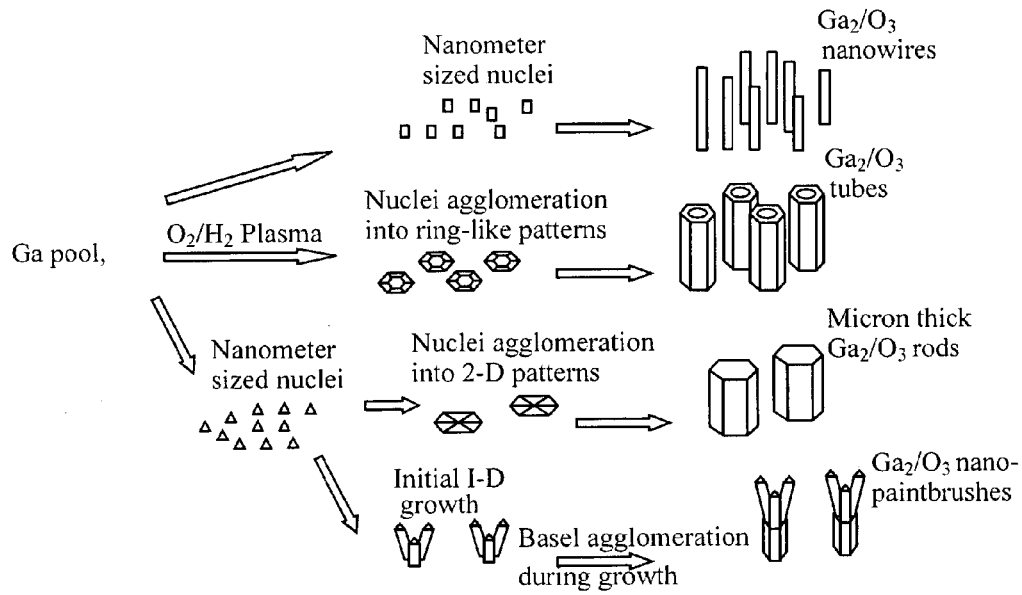
FIG. 21 is a schematic showing multiple nucleation and growth of Gallium oxide nanostructures out of a molten Gallium metal pool upon exposure to appropriate composition of hydrogen and oxygen in the gas phase, whereby the gas phase chemistry allows manipulation of the nanostructure composition, structure, and morphology.

In FIGS. 20 and 21, the schematic depicts possible growth routes for multiple nanowires, tubes, and nanopaintbrushes out of a large metal pool, for example a gallium pool. The proposed three-step mechanism is further analyzed using thermodynamic arguments and a specific set of experiments. The Gibbs free energies for reactions between both molecular and atomic oxygen species with molten gallium to produce solid gallium oxide are determined to be highly negative, which suggests spontaneity. The estimated nuclei size of gallium oxide nucleation out of molten gallium using classical nucleation theory is predicted to be in the nanometer scale for extremely low partial pressures of oxygen in the vapor phase over molten gallium. This suggests that bulk nucleation of nanometer scale gallium oxide nuclei using oxygen vapor over a molten gallium pool is thermodynamically feasible. The main question is however, whether the molten gallium vapor phase interaction results in dissolution or in generation of vapor phase species such as gallium sub-oxides, gallium hydrides, and pure gallium vapor. The generation of vapor phase species would lead to eventual loss of gallium from the experiments. In any case, the overall interaction of monoatomic oxygen with molten gallium is represented with the following set of reactions. Surface species are denoted with star superscripts.

$$Ga_{(l)} + O_{(g)} \rightarrow GaO_{(g)} \tag{1}$$

$$2Ga_{(l)} + O_{(g)} \rightarrow Ga_2O_{(g)} \tag{2}$$

$$Ga_{(l)} + O_{(g)} \rightarrow GaO^* \tag{3}$$

$$2Ga_{(l)} + O_{(g)} \rightarrow Ga2O^* \tag{4}$$

The surface sub-oxide species from (3) and (4) could undergo dissolution to produce sub-surface species and recombination to remove the dissolved oxygen from molten gallium according to:

$$Ga_2O^* \rightarrow Ga_2O_{(l)} \tag{5}$$

$$2Ga_2O_{(l)} \rightarrow 4Ga_{(l)} + O_{2(g)} \tag{6}$$

Reactions 3 and 4 represent chemisorption of oxygen on molten gallium surface, and Reactions 5 and 6 represent dissolution of surface species into the bulk and bubbling in gallium pools upon exposure to the plasma, respectively. The diffusion of chemisorbed oxygen complexes versus the thermal desorption determines the solubility of dissolved oxygenated species within molten gallium. The surface diffusion coefficient is typically orders of magnitude higher than the bulk diffusion coefficient. The average lifetime of a surface adsorbed species is a function of the absolute value of the heat of desorption and temperature. At 600 K, the average lifetime of a chemisorbed species such as $Ga_2O^*$ on the molten gallium surface is estimated to be on the order of 1 second, which is two and five orders of magnitude greater than the characteristic time scales involved with bulk and surface diffusion processes, respectively. A characteristic length scale of 1 μm was assumed. Thus, the surface adsorbed species are much more likely to undergo diffusion processes, bulk or surface, than desorption into the vapor phase. Reactions 1 and 2 represent abstraction of gallium using atomic oxygen to produce vapor phase species and represent continuous loss of gallium metal. A set of experiments was performed to track the mass loss of gallium in the experiments with exposure to a plasma containing only oxygen. After several hours of exposure to oxygen plasma, a thin crust was seen on top of the gallium pool with only a negligible change in weight. Complete conversion of gallium to solid gallium oxide would cause a weight increase of approximately 34%. The experimental results showed nominal net loss of mass indicating that oxygen interaction with molten gallium occurs via a dissolution process much more significantly than chemical vapor transport of gallium using oxide complexes. The thin crust formation and occasional observations of nanowire growth using direct oxygen plasma indicates that hydrogen plays a significant role in preventing crust formation by causing reduction of oxide nuclei to gallium metal. Accordingly, two sets of experiments were performed to observe the interaction of hydrogen plasma with solid gallium oxide and molten gallium. The overall reactions for gallium oxide dissociation are represented in Reactions 7 and 8. Both of these reactions could easily be achieved with either molecular or atomic hydrogen.

$$Ga_2O_{3(s)} + 4H_{(g)} \rightarrow Ga_2O + 2H_2O \tag{7}$$

$$Ga_2O_{3(s)} + 6H_{(g)} \rightarrow 2Ga_{(l)} + 3H_2O \tag{8}$$

The above reactions also compete with the following reactions:

$$Ga + H \rightarrow GaH_{(g)} \tag{9}$$

$$Ga_l + H \rightarrow GaH^* \tag{10}$$

$$GaH^* \rightarrow GaH_{(l)} \tag{11}$$

$$2GaH_{(l)} \rightarrow 4Ga_{(l)} + H_{2(g)} \tag{12}$$

$$H_{(g)} + H_{(g)} \rightarrow H_2 \tag{13}$$

The above set of reactions was examined by performing experiments involving hydrogen plasma exposure of molten gallium and solid gallium oxide in separate runs. After several hours of exposure to hydrogen plasma, the gallium oxide solid phase reverted to metallic gallium with a minimal decrease in the total weight. Over different durations of exposure, the mass loss of molten gallium was within ten percent of the starting molten gallium mass. This loss in mass is much more than the theoretically estimated weight loss due to gallium vaporization at the exposure temperatures and pressures. However, the experimentally observed mass loss is much less than the expected mass loss estimated using typical values of gallium abstraction probabilities with hydrogen and the typical process parameters in the flow reactor. Using similar abstraction probability values for both hydrogen and oxygen, the mass loss of gallium via abstraction process is estimated to occur at linear rates on the order of tens of milligrams per hour. However, a constant mass loss of less than 10 mg was observed over total period of 12-hour exposure to hydrogen plasma. In addition, bubbling of molten gallium was observed during microwave plasma treatment. These results indicate that the interaction of monoatomic hydrogen with molten gallium occurs with chemisorption followed by dissolution of hydrides as indicated by reactions 11, 12, and 13. These observations support the hypothesis that hydrogen is responsible for promoting oxide nanowire growth by etching surface-segregated solid gallium oxide nuclei, thus inhibiting the lateral growth of surface nuclei by agglomeration.

The subsequent growth of surface nuclei could occur through attachment kinetics with the sub-oxide species in the dissolved phase or with gas phase species. However, the observation of minimal loss in the mass of the solid gallium oxide phase upon exposure to hydrogen plasma indicates that the generation of vapor phase gallium sub-oxide species is negligible. This is in contradiction with previously suggested mechanisms for oxide nanowire growth using carbothermal or high temperature reduction. The nanometer scale wires showed insignificant tapering from bottom to top, indicating that growth via basal attachment of growth species is more likely than attachment at the tip or at the nanowire perimeter. Micron-thick wires clearly exhibited tapering only for short lengths from the top and exhibited faceting at the tips, clearly indicating significant etching at the tip of the micron scale rods.

The current efforts are focused on determining the agglomeration dynamics of nuclei on molten gallium surface, necessary to control the morphology of resulting nanostructures.

Apart from $Ga/Ga_2O_3$, it is anticipated that this direct synthesis technique could be extended to oxide nanostructures of other low melting metallic systems. As shown in Table 2, extremely low partial pressures of molecular and atomic oxygen are sufficient thermodynamically for creating nanometer scale nuclei for a variety of other low melting metallic systems such as $Al/A_2O_3$, $In/In_2O_3$, $Sn/SnO_2$ and $Zn/ZnO$. Theoretical estimations of contact angles for these metal oxides with respective molten metals illustrate poor wetting characteristics. Thus, the direct synthesis of nanostructures using appropriate hydrogen/oxygen gas phase chemistry should be applicable to other important metal-oxide systems.

TABLE 2

Minimum partial pressures of monoatomic and diatomic oxygen required for 1 nm sized nuclei of the respective oxides at 1000 K. Thermodynamic properties were obtained from ref 36. The estimated Gibbs free energy values for overall reactions are indicated in square brackets.

| Metal | Overall formation reaction using atomic oxygen | Overall formation reaction using Molecular oxygen | Minimum partial pressure of O required (Torr) | Minimum partial pressure of $O_2$ required (Torr) |
|---|---|---|---|---|
| Ga | $2Ga_{(l)} + 3O_{(g)} \rightarrow Ga_2O_{3(s)}$ [$\Delta G^0 = -1326.2$ kJ/mol] | $2Ga_{(l)} + \frac{3}{2}O_{2(g)} \rightarrow Ga_2O_{3(s)}$ [$\Delta G^0 = -763.1$ kJ/mol] | $4 \times 10^{-18}$ | $9 \times 10^{-19}$ |
| In | $2In_{(l)} + 3O_{(g)} \rightarrow In_2O_{3(s)}$ [$\Delta G^0 = -1169.2$ kJ/mol] | $2In_{(l)} + \frac{3}{2}O_{2(g)} \rightarrow In_2O_{3(s)}$ [$\Delta G^0 = -606.1$ kJ/mol] | $2 \times 10^{-16}$ | $2 \times 10^{-15}$ |
| Al | $2Al_{(l)} + 3O_{(g)} \rightarrow Al_2O_{3(s)}$ [$\Delta G^0 = -1925.2$ kJ/mol] | $2Al_{(l)} + \frac{3}{2}O_{2(g)} \rightarrow Al_2O_{3(s)}$ [$\Delta G^0 = -1362.1$ kJ/mol] | $6 \times 10^{-26}$ | $2 \times 10^{-34}$ |
| Sn | $Sn_{(l)} + 2O_{(g)} \rightarrow SnO_{2(s)}$ [$_\Delta G^0 = 748.2$ kj/mol] | $Sn_{(l)} + O_{2(g)} \rightarrow SnO_{2(s)}$ [$_\Delta G^0 = -372.8$ kJ/mol] | $4 \times 10^{-13}$ | $8 \times 10^{-9}$ |
| Zn | $Zn_{(l)} + O_{(g)} \rightarrow ZnO_{(s)}$ [$_\Delta G^0 = -435.9$ kj/mol] | $Zn_{(l)} + \frac{1}{2}O_{2(g)} \rightarrow SnO(S)$ [$_\Delta G^0 = -248.3$ kJ/mol] | $2 \times 10^{-14}$ | $2 \times 10^{-11}$ |

As shown in the schematic in FIG. 21, growth of tubes and paintbrushes can be explained based on initial nucleation and nuclei movement on the molten gallium surface. In some instances, the use of hydrogen in the microwave plasma allowed agglomeration of nanometer scale surface nuclei into either solid or annular hexagonal patterns. Subsequent attachment of the growth species to solid and annular patterns results in the growth of micron thick hexagonal cross-section solid rods and hexagonal cross-section tubular structures, respectively. Presently, the reason for hexagonal pattern formation is not clear. In the case of agglomeration of neighboring nanometer scale nuclei at an intermediate stage, the structure evolves into paintbrush morphology. This type of agglomeration could occur due to intermittent changes in the gas phase and temperature that are inherent towards the edge of the plasma discharge. Sequential experiments were performed with the synthesis of nanopaintbrushes and tubular structures. It was observed that upon extended exposure to the plasma, the one-dimensional structures shown in FIGS. 12 and 16 converted to nanometer scale wires shown in FIGS. 3 and 22. In some instances, the extended exposure to hydrogen/oxygen plasma, the oxide nanostructures developed branching indicating that secondary nucleation occurred following the hydrogen etching of oxide in the tip region to gallium metal.

The present invention provides a method of synthesizing bulk amounts of highly crystalline gallium oxide tubes, nanowires, and nanopaintbrushes using large gallium pools and a microwave plasma containing atomic oxygen. Direct use of gallium melts in plasma environments allowed bulk synthesis with high nucleation densities and allowed for template-free synthesis of nanostructures with unique geometries. Plasma excitation of gas phase allowed for synthesis of single crystal quality nanostructures at much lower temperatures than commonly reported. In addition, the control of gas phase chemistry allowed the manipulation of the nanostructure composition and morphology. Demonstration of this technique with gallium oxide presents a new route for synthesizing important metal oxides such as indium oxide, tin oxide, and zinc oxide directly using the respective metals.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented hereinabove. Rather, what is intended to be covered is within the spirit and scope of the appended claims.

We claim:

1. A method of synthesizing bulk quantities of oxide nanowires of crystalline noncatalytic low melting metals, comprising the steps of:
    placing said film of noncatalytic low-melting metal on a substrate in a low pressure chamber;
    exposing said noncatalytic low melting metal and to a microwave plasma containing a mixture of a monoatomic oxygen and a monoatomic hydrogen heated to a temperature above the melting point of said low-melting metal;
    forming a film of molten low-melting metal on said substrate;
    activating and decomposing the gas phase and exposing to selected amounts of hydrogen and oxygen in a gas phase;
    forming multiple nucleations and growth of noncatalytic low melting metal nanostructures directly therefrom creating highly crystalline metal oxide nanowires devoid of any structural defects said nanowires having a range of from 20 to 100 nanometers thick and a range of from ten to a thousand microns long.

2. The method of synthesizing bulk quantities of highly crystalline noncatalytic low melting metal nanowires of claim 1, wherein said crystalline metal oxide nanowires comprises β-gallium oxide tubes, nanowires, and nano-paintbrushes.

3. The method of claim 1, wherein nuclei aggregate to form a polycrystalline crust on said molten low-melting metal surface with at least some nuclei segregation on said molten low-melting metal surface preventing complete crust formation whereby nuclei grow in one dimension upon basal attachment to said low-melting metal.

4. The method of claim 1, wherein said substrate is selected from the group consisting of quartz, alumina, pyrolytic boron nitride, glassy carbon, polycrystalline diamond film, porous graphite, and sapphire.

5. The method of claim 1, further comprising the step of controlling hydrogen/oxygen chemistry enabling nuclei segregation on a surface of said molten low-melting metal preventing complete crust formation and forming nuclei growing in one dimension upon basal attachment of a bulk growth species.

6. The method of claim 1, further comprising the step of controlling the dynamics of the pattern formation and the time of nuclei coalescence to determine the morphology of the resulting structure.

7. The method of claim 6, further comprising manipulating the composition, structure, and morphology of said nanowires by controlling the gas phase chemistry.

8. The method of claim 1, wherein said low melting metals comprises Ga, In, Al, Sn, Zn, $Ga_2O_3$, $A_2O_3$, $In_2O_3$, $SnO_2$, Zn/ZnO, and combinations thereof.

9. The method of claim 1, wherein said low melting metal spontaneously oxidizes at a very moderate oxygen partial pressure.

10. The method of claim 1, further comprising means for inhibiting spontaneous nucleation and growth of the metal oxide crust on the molten metal surface.

11. The method of claim 10, wherein hydrogen/oxygen chemistry enables nuclei segregation on the melt surface preventing the complete crust formation.

12. A process for synthesizing bulk amounts of semiconductor nanofibers, comprising the steps of:
    forming a film of at least one low-melting metal on at least one selected substrate;
    placing the low melting metal substrate combination in a low-pressure chamber;
    adding gaseous reactant to said low-pressure chamber;
    applying energy to raise the temperature in said chamber to a point above the melting point of said at least one low-melting metal;
    activating and decomposing the gas phase to yield growth precursors and exposing the molten metal film to the activated gas phase until multiple nanofibers are formed of the desired thickness or length.

13. The method of claim 12, wherein said crystalline metal oxide nanowires comprises β-gallium oxide tubes, nanowires, and nano-paintbrushes.

14. The method of claim 12, wherein nuclei aggregate to form a polycrystalline crust on said molten low-melting metal surface with at least some nuclei segregation on said molten low-melting metal surface preventing complete crust formation whereby nuclei grow in one dimension upon basal attachment to said low-melting metal.

15. The method of claim 12, wherein said substrate is selected from the group consisting of quartz, alumina, pyrolytic boron nitride, glassy carbon, polycrystalline diamond film, porous graphite, and sapphire.

16. The method of claim 12, further comprising the step of controlling hydrogenloxygen chemistry enabling nuclei segregation on a surface of said molten low-melting metal preventing complete crust formation and forming nuclei growing in one dimension upon basal attachment of a bulk growth species.

17. The method of claim 12, further comprising the step of controlling the dynamics of the pattern formation and the time of nuclei coalescence to determine the morphology of the resulting structure.

18. The method of claim 12, further comprising manipulating the composition, structure, and morphology of said nanowires by controlling the gas phase chemistry.

19. The method of claim 12, wherein said low melting metals comprises Ga, In, Al, Sn, and Zn.

20. The method of claim 12, wherein said low melting metal spontaneously oxidizes at a very moderate oxygen partial pressure.

21. The method of claim 12, further comprising means for inhibiting spontaneous nucleation and growth of the metal oxide crust on the molten metal surface.

22. The method of claim 12, wherein hydrogen/oxygen chemistry enables nuclei segregation on the melt surface preventing the complete crust formation.

23. The method of claim 12, wherein said pressure ranged from 30 to 60 Torr.

24. The method of claim 1, wherein said pressure ranged from 30 to 60 Torr.

25. A process for synthesizing bulk amounts of oxide nanowires of low melting metals, the steps comprising:
    forming a film of low-melting metals on a substrate;
    placing the low-melting metal substrate combination in a low-pressure chamber;
    adding gaseous reactant to said low-pressure chamber;
    applying energy to raise the temperature in the chamber to a point above the melting point of said low-melting metal;
    activating and decomposing the gas phase and exposing the molten low-melting metal film to said activated gas phase for a selected time period forming multiple nanofibers of the desired size.

26. The process of claim 25, wherein said substrate comprises fused silica quartz.

27. The process of claim 25, wherein said low-melting metal comprises gallium.

28. The process of claim 25, wherein said gaseous reactant comprises atomic hydrogen, oxygen, nitrogen, and chlorine.

29. The process of claim 27, wherein said nanofibers comprises gallium oxide.

30. The process of claim 25, wherein said low-melting metal comprises gallium, indium, aluminum, zinc, tin, their oxides, and combinations thereof.

31. The process of claim 25, wherein said gaseous reactant is selected from the group consisting of hydrogen, nitrogen, chlorine, oxygen and combinations thereof.

32. The process of claim 25, wherein said substrate comprises quartz, alumina, pyrolytic boron nitride, glassy carbon, polycrystalline diamond film, porous graphite, sapphire, and combinations thereof.

33. The process of claim 25, wherein the energy means provided to raise the substrate temperature and to activate and decompose said gas phase comprises a microwave.

34. The process of claim 1, wherein said substrate is heated to a temperature between the melting point and the boiling point of said low-melting metal.

35. The process of claim 25, wherein said low-melting metal film comprises the shape of a droplet.

36. The process of claim 25, wherein said low-melting metal film comprises the shape of a film.

37. The process of claim 25, further comprising the step of applying hydrogen for promoting oxide nanowires growth by etching surface-segregated solid gallium oxide nuclei and inhibiting the lateral growth of surface nuclei by agglomeration.

38. The process of claim 25, wherein the thickness of the metal nanowires range in thickness from 20 to 100 nanometers thick.

39. The process of claim 25, wherein the length of the metal nanowires range from 10 to 1000 nanometers long.

40. A method of synthesizing bulk quantities of crystalline metal oxide nanowires from noncatalytic low melting metals, comprising the steps of:
    placing a noncatalytic low-melting metal on a substrate in a low pressure chamber;
    simultaneously exposing said noncatalytic low melting metal to a microwave plasma containing oxygen and hydrogen heated to a temperature above the melting point of said low-melting metal forming a molten low-melting metal on said substrate and activating and decomposing an effective amount of said oxygen and said hydrogen creating monoatomic hydrogen and monoatomic oxygen in a gas phase thereby exposing said molten low-melting metal to a sufficient amount of said monoatomic hydrogen and said monoatomic oxygen in said gas phase for forming a metal oxide;
    forming multiple nucleations and growing noncatalytic low melting metal oxide nanostructures directly therefrom creating crystalline metal oxide nanowires devoid of any structural defects.

41. The method of claim 40, wherein said crystalline metal oxide nanowires comprises βgallium oxide tubes, nanowires, and nano-paintbrushes.

42. The method of claim 40, wherein nuclei aggregate forming a polycrystalline crust on a molten low-melting metal surface with at least some nuclei segregation on said molten low-melting metal surface preventing complete crust formation whereby nuclei grow in one dimension upon basal attachment to said low-melting metal.

43. The method of claim 40, wherein said substrate is selected from the group consisting of quartz, alumina, pyrolytic boron nitride, glassy carbon, polycrystalline diamond film, porous graphite, and sapphire.

44. The method of claim 40, further comprising the step of controlling hydrogen/oxygen chemistry enabling nuclei segregation on a molten low-melting metal surface preventing complete crust formation and forming nuclei growing in one dimension upon basal attachment of a bulk growth species.

45. The method of claim 40, further comprising the step of controlling the dynamics of the pattern formation and the time of nuclei coalescence to determine the morphology of the resulting structure.

46. The method of claim 45, further comprising manipulating the composition, structure, and morphology of said nanowires by controlling the gas phase chemistry.

47. The method of claim 40, wherein said low melting metals comprises Ga, In, Al, Sn, Zn, $Ga_2O_3$, $A_2O_3$, $In_2O_3$, $SnO_2$, Zn/ZnO, and combinations thereof.

48. The method of claim 40, wherein said low-melting metal spontaneously oxidizes at a very moderate oxygen partial pressure.

49. The method of claim 40, further comprising means for inhibiting spontaneous nucleation and growth of the metal oxide crust on the molten metal surface.

50. The method of claim 49, wherein hydrogen/oxygen chemistry enables nuclei segregation on the melt surface preventing the complete crust formation.

51. The method of claim 12, where in said pressure is 40 Torr.

52. The method of claim 40, said molten low melting forming a film on said substrate.

53. The method of claim 40, said molten low melting forming a drop on said substrate.

54. The method of claim 40, including the step of forming said nanowires having a range of from 20 to 100 nanometers in diameter and a range of from ten to a thousand microns in length.

55. A method of synthesizing bulk quantities of crystalline metal oxide nanowires from noncatalytic low melting metals, comprising the steps of:
    placing a noncatalytic low-melting metal on a substrate in a low pressure chamber;
    simultaneously exposing said noncatalytic low melting metal to a microwave plasma containing monoatomic oxygen and monoatomic hydrogen in a gas phase heated to a temperature above the melting point of said low-melting metal forming a molten low-melting metal on said substrate and exposing said molten low-melting metal to a sufficient amount of said monoatomic hydrogen and said monoatomic oxygen in said gas phase for forming a metal oxide;
    forming multiple nucleations and growing noncatalytic low melting metal oxide nanostructures directly therefrom creating crystalline metal oxide nanowires devoid of any structural defects.

56. The method of claim 55, wherein said crystalline metal oxide nanowires comprises β-gallium oxide tubes, nanowires, and nano-paintbrushes.

57. The method of claim 55, wherein nuclei aggregate forming a polycrystalline crust on a molten low-melting metal surface with at least some nuclei segregation on said molten low-melting metal surface preventing complete crust formation whereby nuclei grow in one dimension upon basal attachment to said low-melting metal.

58. The method of claim 55, wherein said substrate is selected from the group consisting of quartz, alumina, pyrolytic boron nitride, glassy carbon, polycrystalline diamond film, porous graphite, and sapphire.

59. The method of claim 55, further comprising the step of controlling hydrogen/oxygen chemistry enabling nuclei segregation on a molten low-melting metal surface preventing complete crust formation and forming nuclei growing in one dimension upon basal attachment of a bulk growth species.

60. The method of claim 55, further comprising the step of controlling the dynamics of the pattern formation and the time of nuclei coalescence to determine the morphology of the resulting structure.

61. The method of claim 55, further comprising manipulating the composition, structure, and morphology of said nanowires by controlling the gas phase chemistry.

62. The method of claim 55, wherein said low melting metals comprises Ga, In, Al, Sn, Zn, $Ga_2O_3$, $A_2O_3$, $In_2O_3$, $SnO_2$, Zn/ZnO, and combinations thereof.

63. The method of claim 55, wherein said low melting metal spontaneously oxidizes at a very moderate oxygen partial pressure.

64. The method of claim 55, further comprising means for inhibiting spontaneous nucleation and growth of the metal oxide crust on the molten metal surface.

65. The method of claim 55, wherein hydrogen/oxygen chemistry enables nuclei segregation on the melt surface preventing the complete crust formation.

66. The method of claim 55, said molten low melting forming a film on said substrate.

67. The method of claim 55, said molten low melting forming a drop on said substrate.

68. The method of claim 55, including the step of forming said nanowires having a range of from 20 to 100 nanometers in diameter and a range of from ten to a thousand microns in length.

* * * * *